(12) United States Patent
Dombi

(10) Patent No.: US 10,586,907 B2
(45) Date of Patent: Mar. 10, 2020

(54) LED ILLUMINATION MODULE HAVING PLURAL LED ELEMENTS AND SECONDARY COOLING ELEMENT

(71) Applicant: ADE photonExa GmbH, Stafa (CH)

(72) Inventor: Adam Dombi, Hombrechtikon (CH)

(73) Assignee: ADE photonExa GmbH, Stafa (CH)

( * ) Notice: Subject to any disclaimer, the term of this patent is extended or adjusted under 35 U.S.C. 154(b) by 13 days.

(21) Appl. No.: 15/772,421

(22) PCT Filed: Nov. 3, 2015

(86) PCT No.: PCT/CH2015/000162
§ 371 (c)(1),
(2) Date: Apr. 30, 2018

(87) PCT Pub. No.: WO2017/075722
PCT Pub. Date: May 11, 2017

(65) Prior Publication Data
US 2018/0331267 A1 Nov. 15, 2018

(51) Int. Cl.
*H01L 33/62* (2010.01)
*H01L 33/64* (2010.01)
(Continued)

(52) U.S. Cl.
CPC ............ *H01L 33/648* (2013.01); *F21V 7/005* (2013.01); *F21V 7/0058* (2013.01); *F21V 29/51* (2015.01);
(Continued)

(58) Field of Classification Search
CPC ....... H01L 33/62; H01L 33/64; H01L 33/641; H01L 33/648
See application file for complete search history.

(56) References Cited

U.S. PATENT DOCUMENTS

2008/0011451 A1* 1/2008 Wang .................... H01L 23/367
165/80.3
2009/0129025 A1 5/2009 Kraus et al.
(Continued)

FOREIGN PATENT DOCUMENTS

DE 19605302 8/1997
DE 102012110261 4/2014
(Continued)

OTHER PUBLICATIONS

International Preliminary Report on Patentability of PCT/CH2015/000162, dated May 3, 2018.
(Continued)

*Primary Examiner* — Hoai V Pham
(74) *Attorney, Agent, or Firm* — Cooper & Dunham LLP

(57) ABSTRACT

An LED illumination module is described, where a row of LED elements (1) is arranged via a substrate (16) on a secondary cooling element (2). The secondary cooling element (2) can consist of a first material layer (16, 17) of copper and a second material layer (18) of aluminium. In such material combinations, phononic refraction leads to a good lateral heat distribution, which improves the heat flow and reduces temperature gradients. Alternatively or in addition thereto, the secondary cooling element (2) can be equipped with heat pipes. The LED elements (1) are electrically contacted by means of a current supply member (21) arranged at a distance from the substrate (16).

21 Claims, 2 Drawing Sheets

(51) Int. Cl.
*F21V 7/00* (2006.01)
*F21V 29/51* (2015.01)
*F21V 29/74* (2015.01)
*F21V 29/89* (2015.01)
*F21Y 113/00* (2016.01)
*F21Y 105/10* (2016.01)
*F21Y 115/10* (2016.01)
*F21W 131/101* (2006.01)

(52) U.S. Cl.
CPC .............. *F21V 29/74* (2015.01); *F21V 29/89* (2015.01); *H01L 33/64* (2013.01); *F21W 2131/101* (2013.01); *F21Y 2105/10* (2016.08); *F21Y 2113/00* (2013.01); *F21Y 2115/10* (2016.08); *H01L 33/62* (2013.01); *H01L 33/641* (2013.01); *H01L 33/642* (2013.01)

(56) References Cited

U.S. PATENT DOCUMENTS

| | | |
|---|---|---|
| 2011/0241549 A1 | 10/2011 | Wootton |
| 2011/0273072 A1 | 11/2011 | Oki |
| 2012/0032203 A1 | 2/2012 | Urano |
| 2013/0187189 A1 | 7/2013 | Lin et al. |
| 2014/0231837 A1 | 8/2014 | Singer et al. |
| 2015/0036341 A1 | 2/2015 | Ge et al. |
| 2015/0214194 A1 | 7/2015 | Yan |

FOREIGN PATENT DOCUMENTS

| | | |
|---|---|---|
| EP | 2386789 | 11/2011 |
| EP | 2421062 | 2/2012 |
| EP | 2665092 | 11/2013 |
| EP | 2827046 | 1/2015 |
| JP | 2014135350 | 7/2014 |
| WO | 2010119872 | 10/2010 |
| WO | 2012134305 | 10/2012 |
| WO | 2013045353 | 4/2013 |

OTHER PUBLICATIONS

LUXEON Rebel Plaform—AB32 LUXEON Rebel Plaform Assembly and Handling Information Application Brief, 2015 Lumileds Holding B.V., pp. 1-37.

Office Action for Japanese Patent Application No. 2018-543415, dated Jun. 27, 2019.

* cited by examiner

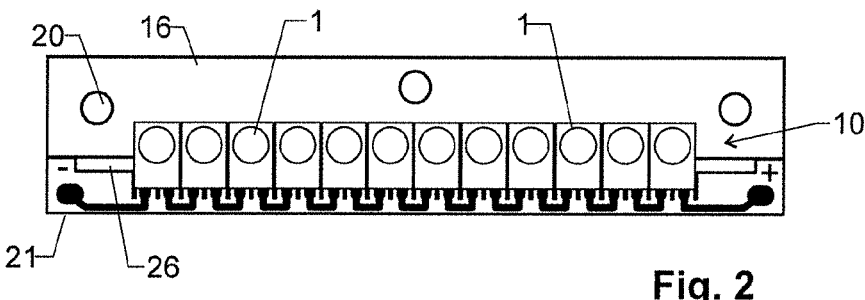
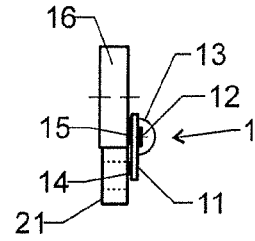
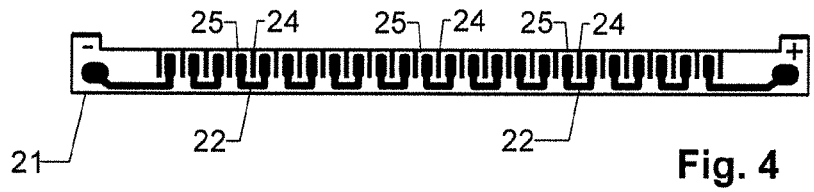
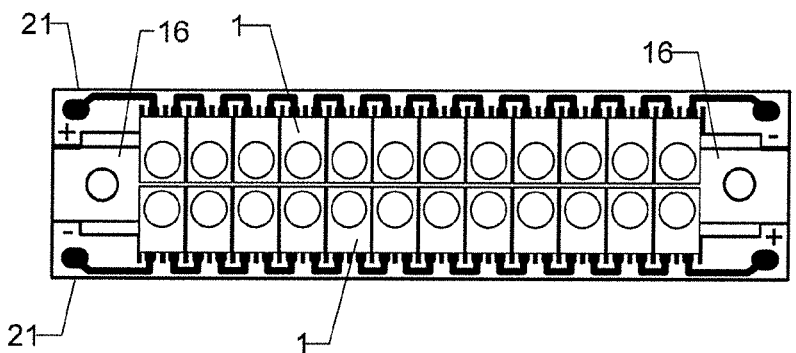
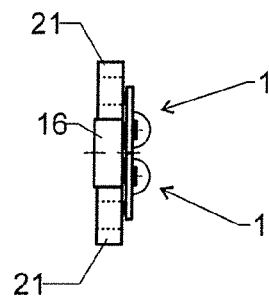
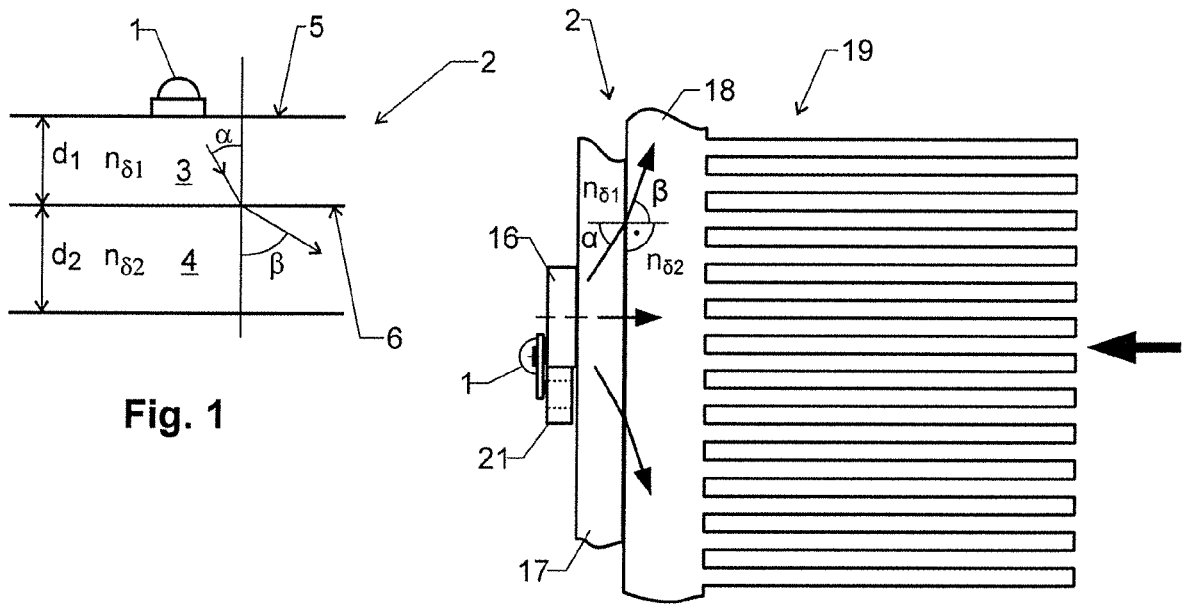

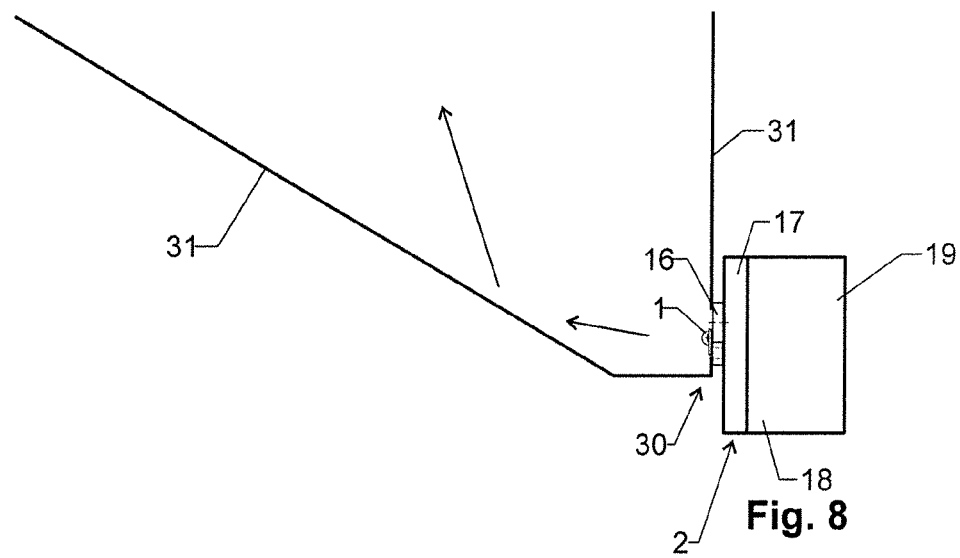
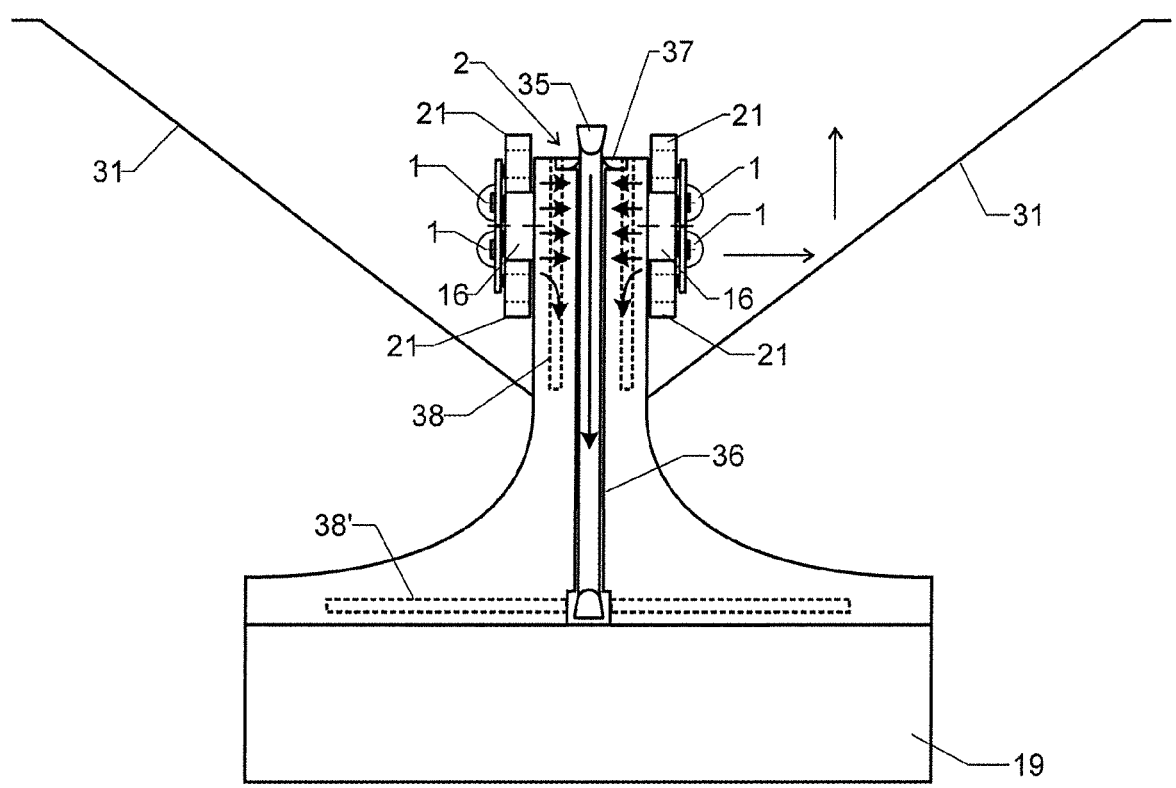

LED ILLUMINATION MODULE HAVING PLURAL LED ELEMENTS AND SECONDARY COOLING ELEMENT

CROSS REFERENCE TO RELATED APPLICATIONS

This application is a § 371 national stage of PCT International Application No. PCT/CH2015/000162, filed Nov. 3, 2015, the contents of which is incorporated herein by reference in its entireties.

TECHNICAL FIELD

The invention relates to an LED illumination module as well as to an LED lamp with at least one such LED illumination module according to the preamble of the dependent claims. In particular, the invention relates to high-power LED light sources in the range of several watts to several kilowatts as they are, for example, but not exclusively, used for general illumination, street illumination, the illumination of objects, workspace illumination, medical illumination as well as technical illumination.

BACKGROUND

Since the semiconductor material (typically GaN, InGaN, AlN, Al—GaN, etc.) of high-power LEDs lack good thermal conductivity, high light powers have to be realized by assembling several LED chips into arrays. The conventional technique for assembling such arrays is by soldering or gluing LED chips (with or without subcarrier) with powers of 0.5 to 5 W using SMD techniques as a matrix on aluminum core circuit boards (typically in an equidistantial grid arrangement). Because of the limited thermal conductivity of aluminum (typically $\lambda_{Al}$=75-235 Wm$^{-1}$K$^{-1}$) distances of typically 20 to 30 mm between the chips have to be maintained—even if the aluminum core circuit board is directly coupled to a powerful cooling system. Therefore, the brilliance and power density of such solutions is limited. If, for example, a typical modern LED array with 5×5 LEDs of 5 W each is arranged in an area of 1 dm$^2$ (100 cm$^2$), a power of 125 W with the average power density of S=1.25 W/cm$^2$ is achieved. For many applications, this is simply not enough. Furthermore, it is difficult to realize non-planar LED arrays with acceptable light guiding quality in this manner.

In EP 2665092 an LED substrate on a base of pure copper with a thin, highly thermally conductive dielectric is shown, which allows for a fourfold power density as compared to aluminum substrates ($\lambda_{Cu999}$=401 Wm$^{-1}$K$^{-1}$). In this manner, the achievable power density rises to S=5 W/cm$^2$, and densely packaged LED clusters of up to four 4 W LED chips arranged directly side-by-side can be built. This has, for example, made it possible to build LED spots with 3×4×4 W=48 W (three clusters of four LEDs and 4 W/LED), which, when focussed by means of TIR lenses, have beam characteristics and electrical power data similar to a MR16-50 W halogen lamp—but yield much more light. However, this system called COC (chip-on-copper) quickly reaches its limit with more than four clustered 4 W-LEDs because copper is a way too poor heat conductor. Low-glare high-powered street lamps with light distribution curves comparable to those of sodium high pressure vapour lamps (HPS) require, however, system powers of 100 to 400 W, and namely with linear LED arrays (clusters of linear light sources) with beamer dimensions of approximately 2.5×38 mm per 50 W module (4.5×38 mm for a 100 W module) and Lambert beam characteristics. This corresponds to a power density of S=52 W/cm$^2$ or 58 W/cm$^2$—i.e. more than ten times above the power densities achieved so far—which corresponds, by the way, to the power density of the solder lamp of a roofer. Furthermore, it should be possible to arrange the arrays in non-planar (i.e. three-dimensional) geometry to be able to build them into symmetric-parabolic and half-ellipsoidal reflectors of pure aluminum in order to maintain the required low amount of glare.

DESCRIPTION OF THE INVENTION

Therefore, the problem to be solved is to provide an LED illumination module as well as an LED lamp that allow to achieve high power densities. This problem is solved by the object of the independent claims.

Accordingly, the LED illumination module comprises several LED elements, each of which comprises an LED semiconductor chip. The LED elements are mounted to a substrate. In order to carry off the heat from the LED elements, at least one secondary cooling element is provided. In order to feed current to the LED elements, a current supply member is provided. It is arranged at a distance from the substrate and comprises power leads for the LED elements, to which the LED elements are connected.

In this manner, carrying off heat can be separated from feeding power, such that the secondary cooling element as well as the current supply member can be optimized for their respective tasks.

Said substrate can be formed by the secondary cooling element, or it can be a device that is additional to the secondary cooling element and that is in thermal contact with the secondary cooling element.

Advantageously, the secondary cooling element comprises a first material layer, wherein LED elements are arranged, directly or indirectly, on a first side of this first material layer. Further, the secondary cooling element comprises a second material layer, which is adjacent to a second side of the first material layer, wherein the second side is opposite to the first side. The phononic refractive index $n_{\delta 1}$ of the first material layer is smaller than the phononic refractive index $n_{\delta 2}$ of the second material layer. The phononic refractive index of a medium is given by $$n_\delta = \frac{C_{Medium}}{\rho_{Medium}} \cdot \frac{1}{n_{\delta c}} + 1$$

where $C_{Medium}$ is the heat capacity of the medium, $\rho_{Medium}$ is the density of the medium and $n_{\delta c}$=1 s$^2$ kg$^2$K/m$^5$.

As discussed below in detail, this choice of material allows to carry off the heat efficiently in a plane parallel to the first side, by means of which the temperature gradients along this direction and the material tensions caused thereby can be reduced.

In addition or alternatively, the secondary cooling element can comprise several heat pipes in order to carry off the heat from the LED elements.

The invention also relates to an LED lamp with at least one such LED illumination module as well as with at least one tertiary cooling element connected thermally to the secondary cooling element in order to carry off heat.

BRIEF DESCRIPTION OF THE DRAWINGS

Further embodiments, advantages and applications of the invention are given in the dependent claims as well as in the following description, which makes reference to the figures. These show:

FIG. 1 an LED element on a secondary cooling element,
FIG. 2 a single-row LED module in top view,
FIG. 3 the module of FIG. 2 in side view,
FIG. 4 the current supply member for the LED module,
FIG. 5 a two-row LED module in top view,
FIG. 6 the module of FIG. 3 in side view,
FIG. 7 the a embodiment of an LED lamp with the module of FIGS. 2 and 3 in side view,
FIG. 8 an LED lamp with the module of FIGS. 2 and 3 and a reflector, and
FIG. 9 an LED lamp with the module of FIGS. 5 and 6 and a reflector.

MODES FOR CARRYING OUT THE INVENTION

Distribution of the Waste Heat of the LED Elements

It is basically known to arrange the LED elements (which comprise the LED chips and, optionally, an electrically insulating carrier) on a secondary cooling element, which carries off the heat from the LED elements. The secondary cooling element is, in its turn, connected to a tertiary cooling element, such as a heat sink.

The aim of the present invention consisted, on the one hand, in finding a better heat conductivity geometry than as it was possible in conventional solutions because the temperature gradients alone, between the clustered (i.e. densely packed) LED chips, can easily be several K/mm, which can lead to large strain in the material, to cracks and to breaks of fatigue at the chip soldering locations. On the other hand a material, or a combination of materials, had to be found that has a thermal conductivity as high as possible, advantageously at least ten times the thermal conductivity of copper. Further, an interface system have to be developed that can transport the heat of the LED cluster with a small temperature gradient to the heatsink, i.e. to the tertiary cooling element, in order to avoid tension cracks at the soldering locations.

In order to achieve a durability of, for example, 100000 h, the junction temperatures must, in addition, not exceed 50 . . . 80° C.

The LED elements are directly or indirectly mounted on the secondary cooling element and are in thermal contact with the same.

As described in more detail below, the electrical connections of the LED chips are advantageously soldered to a current supply member, such as a conventional FR4 circuit board, that has milled slits between the connections. In other words, the current supply member comprises a plurality of mutually spaced apart tongues extending towards the substrate, wherein each soldering pad of the LED elements is connected to one of the tongues. In this manner the shearing forces due to different extension coefficients of the secondary cooling element, of the LED element and of the current supply member can be compensated for.

The LED elements can directly be soldered to the secondary cooling element in one or two rows (i.e. without significant gaps between them). This suppresses a longitudinal (i.e. extending in the direction of the substrate) heat transport and thus local temperature gradients that might damage the soldering locations.

Further, a cooling interface adapted to the power can be used (i.e. a mechanical method of mounting including coupling to the cooling system having a heat distribution that is characterized by low temperature gradients). For this purpose, two techniques have been found to be easy to realize and economical. They are described in the following.

Heat Spreader Technique

This technique is particularly suited for low powers, i.e. for arrays of LED elements in one to three rows for forming LED illumination modules having a total power between 50 and 150 W in planar geometry.

Here, a heat spreader (heat distributor) is used that has a very high thermal conductance in the plane parallel to the plane of the LED elements. The heat spreader is realized as part of the secondary cooling element.

FIG. 1 illustrates such an arrangement. For illustration purposes, a single LED element 1 is shown in FIG. 1 as a heat source. However, usually, several such LED elements are provided side by side. The LED element one is mounted to a large-area secondary cooling element 2. In the shown embodiment, the secondary cooling element is designed as a compound of several material layers.

The LED elements 1 are arranged directly or indirectly on a first material layer 3 of the secondary cooling element 2, namely on a first side 5 of the 2o first material layer 3. The first material layer 3 consists of material with high thermal conductivity, in particular of high purity copper. The thickness of the first material layer 3 is advantageously at least 0.5 mm and/or at most 3 mm. The lower limit is given by the desired mechanical stability. The upper limit depends on the lateral extension of the heat generating area of the LED elements 1, in particular on the lateral extension of the LED chips. Advantageously the thickness corresponds, at most, to lateral extension, in particular to approximately half the lateral extension, of the LED chips because in this manner the lateral heat transport in the first material layer, which could lead to a lift-off of the layers, is reduced.

The LED elements 1 can, as shown in FIG. 1, be directly arranged on the first material layer 3, e.g. by means of soldering, in which case the material layer 3 forms the substrate for receiving the LED elements 1.

Alternatively the LED elements 1 can be mounted (as shown in the later embodiments) on a substrate of high thermal conductivity, e.g. on a metal plate that is separate from the substrate and has a thickness of 0.8 to 1.2 mm, in particular a plate of roll-hardened high purity copper, again in particular by means of soldering. The substrate is then mounted on layer 3 of FIG. 1 in thermally conductive manner, e.g. by means of screwing and by using a thermally conductive paste.

Advantageously, the substrate is of the same material as the first material layer.

A second material layer 4 of the secondary cooling element 2 is adjacent to a second side 6 of the first material layer 3, wherein the second site 6 is opposite to the first side 5 of the first material layer 3. The second material layer 4 consists of a material of lower thermal conductivity, in particular of aluminum. Its thickness is advantageously between 0.5 and 12 mm, depending on the heat sink area of the tertiary cooling system, which gives off the heat to the environment. The optimum is given by the specific geometry. If the heat sink area of the tertiary cooling system is large, a high thickness is used advantageously.

A heatsink (typically a hollow profile streamed through by cooling air) as a tertiary cooling element (not shown) can be adjacent to the second material layer.

This copper/aluminum-design equalizes, on the one hand, the Z position of the isothermal surfaces, i.e. the temperature gradients in the direction parallel to the surface, i.e. to side 5, are low. This allows a stable operation free of malfunctions and without tension cracks at the LED soldering locations. Further compound material acts as a heat spreader—just like an optical focus-offset plate—because, for a desired heat distribution with a power $P_{th}$ over a given area A, a substantially smaller thickness d of a material with a given thermal conductivity $\lambda$ has to be crossed as compared to a single, highly thermally conductive material. Thus, apparent heat resistance $R_{th}$ is decreased—and therefore also the temperature difference $\Delta T$. In the stationary, homogeneous case we have $$R_{th} = \frac{d}{\lambda \cdot A} = \frac{\Delta T}{P_{th}} \qquad \text{Eq. 1; 2}$$

The heat transport equation T=u(x, y, z, t) yields the exact temperature of a solid at a given point and a given time. However, the determination of the gradients as the normal directions to the isothermal surfaces is very complex. Therefore, for the analysis, a simplified quantum-theoretical approach by means of phonons is used. (The phonon or deltron (symbol $\delta$) is a quantum-mechanical quasi-interaction particle for the heat flow dQ/dt.) This approach, even though it has a quickly increasing error for large divergence angles, makes it possible to achieve, with sufficient accuracy, a simplification of the design for small angles—at the cost of time-domain information.

For this purpose, the term of the phononic refraction is introduced—in analogy to the photonic, dielectric and magnetically permeable refraction at interfaces between the material layers. In this manner, the temperature gradients can be represented, without the need for complex calculations in the time domain, as vectors showing the path of the heat flow—in analogy to an optical path extending through interfaces.

This is achieved by defining the differences in the phononic index of refraction no of the two materials for describing the increase of the spatial heat distribution. Thus, in a first approximation, the law of refraction of Snellius can be used in inverse an inverse form. As a prerequisite, the refractive indices of the involved media must be known. For electromagnetic waves as well as for electrical and magnetic fields, the refractive index n is defined as the quotient between the speed of propagation $v_m$ in the medium as compared to the speed of light c in vacuum.

$$n = \frac{c}{v_m} \qquad \text{Eq. 3}$$

The propagation velocity of a phononic step $T_0 \cdot 1(t)$ in a solid—wherein $\Delta T_0$ is the step temperature—can, in this manner, neither be reasonably measured nor defined because the transmission function of the thermal conductivity at short wavelengths (i.e. when neglecting transport delay) is a PT1 member in the La-place domain G(s) with the temperature difference amplitude $\Delta T_0$ and a time constant $\tau$.

$$G(s) = \frac{\Delta T_0}{1 + \tau \cdot s} \qquad \text{Eq. 4}$$

Hence, an exponential saturation function as a step response in the time domain T(t) is obtained with $$T(t) = \Delta T_0 (1 - e^{-\frac{t}{\tau}}), \qquad \text{Eq. 5}$$

which is vaguely reminiscent of the fundamental solution of the heat transport equation for the one-dimensional case. If the ratio between the surfaces A of the materials to be crossed by the phonons to the thickness d is very large and the thicknesses of the materials are approximately the same range (a few mm), differences in the time constants play a role that is, even though not neglectable, still of minor importance. For simplification, it has been neglected at the cost of an error that quickly increases with the angle of dispersion.

Based on purely logical considerations, for $\rho_{Medium}$ (density of the medium kn kg/m³) and the specific heat capacity $C_{Medium}$ (J·K⁻¹·kg⁻¹) as well as for the normalized refractive index $n_{\delta c}$=1 s² kg²K/m⁵ as a formal replacement of the speed of light in vacuum, the phononic index of refraction no can be written in simplified manner as $$n_\delta = \frac{C_{Medium}}{\rho_{Medium}} \cdot \frac{1}{n_{\delta c}} + 1 \qquad \text{Eq. 7}$$

In this way we obtain a dimension-less quantity, which we can insert, in inverse manner, in Snellius' law of refraction as an approximation with the conditions $n_{\delta 1} < n_{\delta 2}$ and $\lambda_1 > \lambda_2$; wherein $\lambda_n$ is the thermal conductivity of the respective layer of material:

$$\frac{\sin(\alpha)}{\sin(\beta)} \approx \frac{n_{\delta 1}}{n_{\delta 2}} \qquad \text{Eq. 8}$$

The angles $\alpha$ and $\beta$ are shown in FIG. 1.

The increase in the angle of transfer and the corresponding infinitesimal increase of surface $dA_{Quelle} \rightarrow dA_{Senke}$ for each phonon results in a total heat resistance of the material compound that appears to be much lower than the heat resistance as it would result from the heat flow through the higher thermally conductive metal of the compound. Obviously, this apparent "decrease" of the specific heat resistance works only for a one- or two-dimensional divergent heat transport application (e.g. when the heat of a point- or line-shaped heat source can be distributed to a large cooling area). If the heat transport extends only perpendicularly to the plane of transition, the refraction disappears and the heat resistances are added to each other—according to the known laws.

Therefore, the extension of the secondary cooling element should be sufficiently large. If the LED elements are arranged along a direction X in a row arrangement of the width B (in a line or in two parallel, adjacent lines), the extension of the secondary cooling element 2 perpendicular to line X and parallel to the LED-element-facing surface of the secondary cooling element 2 should be at least 2·B, in particular at least 5·B.

Because of the approximations mentioned above, errors occur that are, according to measurements, in a range of approximately +10% for small angles. From an angle of incidence of approximately 45° the error increases quickly and leaves, for the Cu—Al-compound, the range of definition of the arcsin function for $\alpha > 51.5169°$. For designing a cooling system, however, experience shows that this accuracy is completely sufficient because the lateral temperature difference represents a Gaussian distribution function, for which at a full angle of 90° the relative temperature difference $\Delta T(\Phi = \pm 45°)/\Delta T(\Phi = 0°)$ falls below the value of $1/e^2$ (approximately 13.5%). Therefore, at this point a more accurate calculation of $n_\delta$ can be dispensed with.

Numerical Example $$C_{Cu} = 382 \text{ J·kg}^{-1}\text{·K}^{-1} \quad \rho_{Cu} = 8960 \text{ kg/m}^3 \Rightarrow n_{\delta Cu} = n_{\delta 1} = 1.0426$$

$$C_{Al} = 896 \text{ J·kg}^{-1}\text{·K}^{-1} \quad \rho_{Al} = 2'700 \text{ kg/m}^3 \Rightarrow n_{\delta Al} = n_{\delta 2} = 1.3319$$

For an angle $\alpha = 45°$ we obtain, after re-arranging Eq. 8 and evaluation $$\beta = \arcsin\left(\frac{\sin(\alpha) \cdot n_{\delta 2}}{n_{\delta 1}}\right) = 64.5972° \quad \text{Eq. 9}$$

Because the dispersion is a function of the inverse cosine of the angle difference, two phonons propagating in parallel and having the infinitesimal distance $dS_1$ have a dispersion $dS_2 = dS_1/\cos(\beta - \alpha) = 1.0615 \cdot dS_1$. The power density $S$ (W/m$^2$) is even the square thereof, which corresponds to a power dispersion factor $S_1/S_2$ of 1.1268.

Heat Pipes

For high powers in the range of 100 . . . 400 Watt—but in particular in three-dimensional, non-planar arrays—the techniques described under lit. a) cannot be used without further measures alone because the extremely high thermal power densities again lead to very high local temperature gradients, which again generate high shear forces—beyond the breaking point—at the heat transferring soldering locations of the LED chips because of the locally different thermal extension of the copper.

For this application, a thermo-mechanical heat distribution and heat conductance interface system is proposed, by means of which the heat of the common LED array cooling pad is transferred along the shortest path, i.e. perpendicularly, through a relatively thin copper layer, into an array of heat pipes, which extends—depending on requirements and mounting position—perpendicularly or horizontally to the direction of the linear light source. The heat pipes are soldered in bores in a cops perplate, or they are glued into them, e.g. by means of silver-containing heat conductive epoxy. Also, a heat conductive clamping of the heat pipes can be used.

A heat pipe is understood to be a hermetically capsuled tube containing a fluid that evaporates in the hotter region of the heat pipe and condenses in the cooler region of the heat pipe and thus transports heat between the two regions.

An array of heat pipes embedded in the secondary cooling element has, as compared to conventional secondary cooling systems, some important advantages:

Highly homogeneous lateral heat resistances (i.e. within the mounting plane of the LED arrays) can be achieved, which can be by orders of magnitude smaller than those of aluminum, gold, copper or silver.

The use of an array provides redundancy to the cooling system. When dimensioned properly, a certain number of heat pipes can fail without causing the whole illumination system to fail. A temperature monitoring can ensure that the LED arrays are not thermally destroyed even in the case of a failure.

At powers of several 100 W, the technology makes it possible to build extremely compact, long-lived and brilliant LED high-power light sources for all conceivable applications. The possibility to build three-dimensional high-power LED arrays further offers new possibilities in LED illumination techniques, which have so far been exclusive to arc lamps or halogen lamps.

Inexpensive mesh type heat pipes with water as a heat transport medium can be used. Operating temperatures below the freezing point are still no problem because conventional cracks due to the expansion of the frozen working medium can be avoided constructively and the surrounding copper acts as a heat conductor during start-up of the LED system until the melting point of the water is exceeded. Then the heat pipes start to work in their specified manner.

The system saves material and can be industrially manufactured in inexpensive manner (using drilling/milling, soldering or gluing techniques, etc.).

Combination of Heat Pipes and Heat Spreader

The systems of the two preceding sections can be combined. This allows to combine the advantages of both solutions, e.g. when a symmetric or partially symmetric reflector with two oppositely arranged linear LED arrays mounted on a planar secondary cooling plate, as described in the section "heat spreader", is to be realized. In the secondary cooling element, the heat is transferred by means of heat pipes to a finned heat sink that is arranged perpendicularly thereto, i.e. at the front side (see below).

First Embodiment LED Illumination Module

A first embodiment using the heat spreader technique is shown in FIGS. 2-4 and 7.

In the shown embodiment an LED linear light source (a linear array) of several LED elements 1 is provided. The LED elements one can for example be twelve LEDs of the type Phillips-Lumi-LED-Rebel® with a total input power of $P_{electric} \leq 50$ W.

The LED elements 1 used here each have an electrically insulating carrier 11 wherein an LED chip 12 is arranged on a first side of carrier 11 (cf. FIG. 3), which can cooperate with suitable optics 13. Advantageously, on the second side of carrier 11 (which is arranged opposite to the first side of carrier 11), electrical contact pads 14 are provided, by means of which current can be applied to the LED elements 1. Further, on the second side of carrier 11, in an area opposite the LED chip 12, at least one heat conducting pad 15 is arranged, which serves to carry off heat and which is advantageously formed by a metal area that can be soldered.

The secondary cooling element 2 of the LED illumination module is, in the shown embodiment, designed in several parts. On the one hand, a substrate of roll-hardened pure electrolytic copper is provided, which can be protected from corrosion by means of a layer of Ni/Ag. It is mounted to a plate 17 of copper, which is adjacent to a block 18 of aluminum (cf. FIG. 7). The aluminum block 18 is arranged on the side of substrate 16 that is opposite to the LED elements 1 and it forms, for example, part of a finned heatsink 19. The finned heatsink 19 also serves as a tertiary cooling element.

Plate 17 and aluminum block 18 together form, as illustrated in FIG. 7, a heat spreader of the type described in FIG. 1, with plate 17 being the first material layer 3 and aluminum block 18 being the second material layer 4.

High-performance heat conductive paste can be arranged between plate 17 and aluminum block 18, as well as between substrate 16 and plate 17. Openings 20 are provided in substrate 16 in which screws can be arranged for connecting substrate 16 to plate 17 and aluminum block 18. It is also possible to connect the parts by means of a central screwed bolt or a solder having a low melting point (e.g. based on bismuth or indium). Gluing using a heat-conductive high-performance glue (e.g. based in silver) is possible as well.

The heat conducting pads 15 of the LED elements 1 are soldered to substrate 16. The distances between the LED elements 1 are minimal and amount to approximately 0.05 mm in order to avoid mechanical tension during mounting.

Further, the LED illumination module has a current supply member 21, which can, e.g., be mounted by means of spacers directly on substrate 16.

An individual current supply member 21 is shown in FIG. 4. Advantageously it is a printed circuit board, for example of FR4. It is self-supporting, i.e. it does not substantially deform under the influence the forces that occur in operation due to gravity, vibrations or movement.

In the region of the LED elements 1, current supply member 21 is at a distance from secondary cooling element 2 in order to avoid mechanic tension.

In the region of the LED elements 1, the current supply member 21 further extends parallel to the surface or lateral edge of the secondary cooling element 2, and the air gap 26 between the components has advantageously a width larger than 0.1 mm and/or smaller than 5 mm.

The current supply member 21 forms power leads 22. The contact pads 14 of the LED elements 1 are directly soldered to these power leads 22.

As can be seen from FIG. 4, a plurality of slits 24 are cut into the current supply member 21, such that it forms several, mutually spaced apart tongues 25. Each contact pad 14 of an LED element 1 is connected to one of these tongues 25.

By using the mentioned tongues 25, the thermal tensions at the solder locations, due to the differing thermal extension coefficients of the components, are reduced because the tongues can move laterally in elastic manner.

The LED elements 1 and the current supply member 21 can be soldered commonly by means of a soldering mask.

Second Embodiment of the LED Illumination Module

FIGS. 5 and 6 show a second embodiment of an LED illumination module. It differs from the first embodiment by having two rows of LED elements 1 arranged on substrate 16. For example, 24 LED elements with an input power of $P_{electric} \leq 100$ W can be provided.

In this embodiment, two current supply members 21 extend on opposite sides and parallel to and at the distance from secondary cooling element 2 and also from substrate 16. Each of the current supply members 21 feeds one row of the LED elements 1. This geometry allows to realize a substantially line-shaped light source of high power.

Substrate 16 is again mounted on a secondary cooling element 2.

First Embodiment LED Lamp

FIG. 8 shows a first embodiment of an LED lamp, for example using the LED illumination module according to FIGS. 2-4 and 7.

The figure shows an asymmetric tunnel lamp with three 50 W arrays (system power 150 W), which exploits the phononic refraction on an interface according to FIG. 1.

Further, an asymmetric reflector 31 is provided, which distributes the light from the LED illumination modules 30.

A finned heatsink can e.g. be used as tertiary cooling element 19, in the manner shown in FIG. 7.

Second Embodiment LED Lamp

FIG. 9 shows a symmetric floodlight lamp using heat pipes 35.

In this embodiment at least two LED illumination modules 30 of the variant described above are provided, between which a common secondary cooling 2o element 2 is arranged. The secondary cooling element 2 forms a T-shaped cooling interface, which gives off the heat to a tertiary cooling element 19. The tertiary cooling element 19 is, for example, designed as a finned heatsink or the liquid cooled heatsink.

As can be seen from FIG. 9, the T-shaped secondary cooling element 2 forms a fin section 2a and a head section 2b extending perpendicularly to each other, wherein the LED illumination modules 30 are arranged at opposite sides of the fin section and the tertiary cooling element 19 is arranged adjacent to the head section. The reflector 31 is arranged at opposite sides of the fin section.

Several heat pipes 3 extend in secondary cooling element 2 in order to feed the heat from the LED illumination modules to the tertiary cooling element 9. Advantageously, the heat pipes 3 are arranged in bores, which extend through the secondary cooling element 2.

Also shown in FIG. 9 is a solder- or glue-location 37 with a milled container for solder or glue, which receives the superfluous solder or glue during degassing.

Further, FIG. 9 schematically shows a reflector 31, which is arranged symmetrically in respect to the LED illumination modules.

The direction $P_{th}$ of flow of the heat is shown with arrows in FIG. 9. The primary heat flow enters perpendicularly into the secondary cooling element 2, is received by the heat pipe array, and is fed to the tertiary cooling element 19. If the system start-up temperatures are below the freezing point, the heat transport medium (e.g. water) in the heat pipes can be frozen. In that case, the heat takes the path of the arcuate arrows through the copper of the secondary cooling element 2 and melts the ice. As soon as the same is completely molten, the heat transport path as described above is established.

For example, in this embodiment, four of the LED illumination modules of 50 W each as shown in FIG. 4 can be used, such that the total power is 200 W.

If two 200 W systems—i.e. a total of 400 W—are built into a lamp with the dimensions of L×B×H=250×180×200 mm and a net efficiency (i.e. after subtracting the losses of the reflectors and the light droop) of 115 Lm/W, the lamp yielded a directed light flow of $\Phi_v$=46 kLm. This is sufficient for being used as a lamp for the illumination in a soccer stadium during 100000 h. Conventional LED systems only achieve approximately 5 . . . 10% of this power density. Modern high-pressure Xenon lamps reach such light fluxes without problems—but they only have a lifetime of a few hundred hours and are very expensive.

Alternatively to, or in addition to, the heat pipes 35, at least one aluminum plate can be provided in secondary cooling element 2 in order to exploit the phononic refraction described above.

For example, a slit can be arranged in secondary cooling element 2, in which a body 38 of aluminum is arranged, as it is shown in FIG. 9 dashed lines. The body of aluminum 38 can e.g. glued, soldered or screwed to the copper.

Alternatively or in addition thereto, a body 38' of aluminum can be arranged on the side of the secondary cooling element that faces the tertiary cooling element 19, in order to improve the thermal distribution to the tertiary cooling element 19 by means of the phononic refraction.

In order to provide a good thermal connection between the bodies 38 and 38', respectively, with the rest of the secondary cooling element 2, screws can be arranged perpendicularly to the planes of the slits in order to press the walls of the slits against the bodies 38 and 38', respectively.

The arrangement of the bodies 38, 38' in slits of the secondary cooling element 2 has the advantage that the complex, simultaneous handling of several parts coated with heat conductive paste can be dispensed with. However, it is also possible to use a sandwich structure. For example, an Al999 plate with a thickness of e.g. 0.5 to 1.5 mm can be inserted between substrate 16 and the copper body of the secondary cooling element. In similar manner, an aluminum sheet with a thickness between 2 and 10 mm can be arranged between the foot section of the copper body of the secondary cooling element 2 and the copper tertiary cooling element 19.

Notes:

The present technique allows to realize a linear, planar or non-planar (i.e. three-dimensional) LED high power lighting system. The technique is particularly suited for cooling one or more rows of LED elements where the width of the area covered by the LED elements is substantially smaller than its length.

The optical fill factor $f_O$ can be larger than or equal to 0.2. (Note: the optical fill factor $f_O$ of an illuminating surface is defined as the ratio given by the sum of all light-emitting (chip-)surfaces and the surface given by the outer bounds of the light emitting elements of given geometric arrangement.)

The LED elements can be clustered, i.e. they can be mounted without a substantial distance between each other. Conventional power LED elements—with or without ceramic submount—can be used.

The LED elements can, as mentioned, the arranged on a substrate. A roll-hardened copper or silver substrate is particularly suited for this purpose.

The attachment of the LED elements on the substrate is advantageously carried out by means of soldering of gluing in a heat conductive manner.

The substrate can comprise elements (such as bores or projections) which allow a defined alignment of the LED elements in relation to the line of the linear light source and for mounting on the secondary cooling element by means of screwing, gluing, soldering or pressing.

The substrate can, at least on the mounting side of the LED elements, be aluminized, i.e. be provided with an aluminum coating, in which case it can form part of an optical reflector system. At the same time, an efficient corrosion protection is provided in this way.

The secondary cooling element (also designated as heat spreader or heat coupling interface) facilitates the heat transfer to a tertiary cooling element. In this process, the high heat density from the small substrate of the LED elements is reduced, by means of a compound material having a high, but—along the direction of the light source— constant temperature gradient, and transported to the larger heat sink surface of the tertiary cooler (which is, usually, an air-flow cooled finned heat sink or finger heat sink).

The thermally contacted, planar parallel compound material of the secondary cooling element consists, on the hot side, of a first material layer with a smaller ratio of specific heat capacity and specific weight (e.g. Cu, Ag or Au), with, on the cold side, an adjacent second material layer. The second material layer is formed by a heat conductor with a larger ratio of specific heat capacity and specific weight (e.g. Al, Mg, C), such that at the interface a phononic refraction according to the inverse Snellius law occurs and the compound can distribute more heat power with a smaller lateral temperature difference to the secondary cooling surface using less material (weight and volume) as one of the two materials alone could provide.

The first material layer is advantageously a metal layer. In particular, it advantageously consists by at least 99.9 weight percent of at least one material from the group of copper, silver and gold because even low alloy additions can strongly affect the thermal conductivity.

Also the second material layer is advantageously a metal layer. In particular, it advantageously consists by at least 90 weight percent of at least one material from the group of aluminum and manganese. However, the second material layer can also be non-metallic layer, in particular a layer that consists by at least 90 weight percent of carbon.

For reasons of cost and manufacturing, it is presently preferred to use a combination of a first material layer of at least 99 weight percent copper and a second material layer of at least 90 weight percent aluminum.

As shown in connection with the embodiment of FIG. 9, the secondary cooling element is not necessarily planar. This non-planar secondary cooling element (e.g. with a shape that is two-sided planar parallel, quadratic, rectangular, prismatic or in the shape of a flattened pyramid, and which is also called a heat distributor or heat coupling interface), e.g. of the type as shown in FIG. 9, connects the LED elements to the tertiary cooling element and thus to the heat sink and the environment.

In this embodiment the heat exits from the comparatively small, densely packed LED elements as a heat flow into the mounting surface of the secondary cooling element, on which the LED elements are mounted, and thus into a body of a highly thermally conductive material (e.g. Cu, Ag, Al). From there, the heat arrives with a minimum temperature gradient at an array of heat pipes, which are thermally coupled e.g. by means of soldering, heat conductive glue or clamping, and thus is transported to the heat sink or the tertiary cooling element.

The heat pipe array can extend parallel or perpendicularly to the main beam direction of the LED elements.

It is advantageous, for a low-gradient heat transfer function, to mount the heat pipe arrays perpendicularly and/or horizontally to the mounting surface of the LED arrays.

In the embodiment of FIG. 9, e.g. a planar parallel double light array is used, where the axis of the heat pipes extends parallel to the normal of the arrays, i.e. perpendicular to the longitudinal axis of the row of LEDs.

The temperature gradients acceptable for a given power and geometry can be calculated by means of a FEM program, and the results can be checked thermographically.

If several heat pipes are provided, redundancy is achieved. Hence, the whole system remains functional even after failure of a certain part of the heat pipes (e.g. due to fabrication flaws).

The manner in which the heat is transferred to the environment, i.e. the specific nature of the tertiary cooling element, is not decisive.

The described secondary cooling elements can also be used with other LED array geometries. Thus, surface array geometries with an optical filling factor $f_O$ larger than 0.2 can be realized. Also, linear LED arrays of one or two rows can be operated in combination with other suitable secondary cooling elements.

In particular, a novel, clustered linear LED array (called a linear light source) with high power density is described, in which conventional LED elements are mounted (as flip chip, bonded or on a submount), with a high optical and thermal filling factor, to a comparatively thin secondary cooling element, e.g. by means of soldering, gluing or welding. Almost no lateral temperature gradients, which might lead to local differences in the thermal expansion and to a loss of the thermal contact between chip and substrate, are generated.

The electrical connections of the LED and of the module are advantageously also protected from thermally-induced mechanical overload by means of a slitted current supply member connected to the secondary cooling element.

While preferred embodiments of the invention are described in the present application, it is to be pointed out that the invention is not limited to the same and can be differently carried out within the scope of the following claims.

The invention claimed is:

1. An LED illumination member comprising
several LED elements, each of which comprises an LED semiconductor chip,
a substrate for receiving the LED elements,
a secondary cooling element for carrying off waste heat from the LED elements,
two current supply members arranged at a distance from said substrate and comprising power leads for the LED elements,
wherein the power leads are connected to the LED elements,
wherein each current supply member extends parallel to and at a distance from said substrate such that an air gap is located between the current supply member and the substrate, and
wherein two rows of LED elements are arranged on the substrate, and wherein said two current supply members extend on opposite sides, parallel to and at a distance from the substrate, wherein each current supply member feeds one of the rows of LED elements.

2. The LED illumination module of claim 1 wherein said air gap has a width larger than 0.1 mm and/or smaller than 5 mm.

3. An LED illumination module comprising
several LED elements, each of which comprises an LED semiconductor chip,
a substrate for receiving the LED elements, and
a secondary cooling element for carrying off waste heat from the LED elements,
a current supply member arranged at a distance from said substrate and comprising power leads for the LED elements,
wherein the power leads are connected to the LED elements,
wherein the secondary cooling element comprises:
a first material layer, wherein the LED elements are arranged on a first side of the first material layer and
a second material layer, which is arranged adjacent to a second side of the first material layer, wherein the second side is opposite to said first side,
and wherein a phononic index of refraction $n_{\delta 1}$ of the first material layer is smaller than a phononic index of refraction $n_{\delta 2}$ of the second material layer, wherein the phononic index of refraction of a medium is given by $$n_\delta = \frac{C_{Medium}}{\rho_{Medium}} \cdot \frac{1}{n_{\delta c}} + 1$$

wherein $C_{Medium}$ is the heat capacity of the medium, $\rho_{Medium}$ is the density of the medium and $n_{\delta c}=1$ s$^2$ kg$^2$K/m$^5$,
and wherein a thermal conductivity $\lambda_1$ of the first material layer is larger than a thermal conductivity $\lambda_2$ of the second material layer,
wherein the LED elements extend along a direction X in a row of a width B, and wherein an extension of the secondary cooling element, perpendicular to the direction X and parallel to the surface of the secondary cooling element facing the LED elements, is at least 2·B, in particular at least 5·B.

4. An LED illumination module comprising
several LED elements, each of which comprises an LED semiconductor chip,
a substrate for receiving the LED elements, and
a secondary cooling element for carrying off waste heat from the LED elements,
a current supply member arranged at a distance from said substrate and comprising power leads for the LED elements,
wherein the power leads are connected to the LED elements,
wherein the secondary cooling element comprises several heat pipes to carry off heat from the LED elements, and
wherein the heat pipes are arranged in bores of the secondary cooling element.

5. The LED illumination module of claim 4, with at least two rows of LED elements arranged on opposite sides of the secondary cooling element wherein the heat pipes extend from a region between the LED elements to an interface surface for the secondary cooling element.

6. An LED illumination module comprising
several LED elements, each of which comprises an LED semiconductor chip,
a substrate for receiving the LED elements, and
a secondary element for carrying off waste heat from the LED elements,
a current supply member arranged at a distance from said substrate and comprising power leads for the LED elements,
wherein the power leads are connected to the LED elements,
wherein the current supply member extends parallel to and at a distance from said substrate such that an air gap is located between the current supply member and said substrate,
wherein each LED element comprises an electrically insulating carrier and an LED chip on a first side of the carrier,
wherein contact pads are provided on the carrier of each LED element on a second side opposite to said first side, which contact pads are directly soldered to said current member,
wherein the current supply member comprises a plurality of mutually spaced apart tongues, wherein each of the contact pads is connected to one of the tongues, and
wherein two separate tongues are provided for the contact pads of each LED element.

7. The LED illumination module of claim 6 wherein the secondary cooling element comprises:

a first material layer, wherein the LED elements are arranged on a first side of the first material layer and
a second material layer, which is arranged adjacent to a second side of the first material layer, wherein the second side is opposite to said first side,
and wherein a phononic index of refraction $n_{\delta1}$ of the first material layer is smaller than a phononic index of refraction $n_{\delta2}$ of the second material layer, wherein the phononic index of refraction of a medium is given by $$n_\delta = \frac{C_{Medium}}{\rho_{Medium}} \cdot \frac{1}{n_{\delta c}} + 1$$

wherein $C_{Medium}$ is the heat capacity of the medium, $\rho_{Medium}$ is the density of the medium and $n_{\delta c}$=1 s² kg²K/m⁵,
and wherein a thermal conductivity $\lambda_1$ of the first material layer is larger than a thermal conductivity $\lambda_2$ of the second material layer.

8. The LED illumination module of claim 7 wherein the first material layer is a metal layer, and in particular wherein it consists by at least 99.9 weight percent of a material selected from the group of copper, silver, and gold.

9. The LED illumination module of claim 7, wherein the second material layer is a metal layer, and in particular wherein it consists by at least 90 weight percent of a material selected from the group of aluminium and manganese.

10. The LED illumination module of claim 7, wherein the second material layer consists by at least 90 weight percent of carbon.

11. The LED illumination module of claim 7, wherein, in a direction perpendicular to the first side, the first material layer has a thickness between 0.4 and 3 mm, and/or the second material layer has a thickness between 0.5 and 12 mm.

12. The LED illumination module of claim 7, wherein, in a direction perpendicular to the first side, the first material layer has a thickness that corresponds to no more than a lateral extension of LED chips used in the LED elements.

13. The LED illumination module of claim 7, wherein the secondary cooling element comprises a body of the first material in which a slit is arranged, wherein a body of the second material is arranged in said slit.

14. The LED illumination module of claim 6, wherein each LED element comprises an electrically insulating carrier and an LED chip on a first side of the electrically insulating carrier.

15. The LED illumination member of claim 14, wherein contact pads are provided on the electrically insulating carrier of each LED element on a second side opposite to said first side, which contact pads are directly soldered to said current supply member,
and/or wherein the current supply member is formed by a printed circuit board.

16. The LED illumination module of claim 15 wherein the current supply member comprises a plurality of mutually spaced apart tongues, wherein each of the contact pads is connected to one of the tongues.

17. The LED illumination module of claim 16 wherein two separate tongues are provided for the contact pads of each LED element.

18. The LED illumination module of claim 14 wherein the electrically insulating carrier of each LED element is soldered to the substrate in a region opposite the LED chip.

19. The LED illumination module of claim 14 wherein the current supply member is formed by a printed circuit board.

20. The LED illumination module of claim 6, with at least two rows of LED elements arranged on opposite sides of the secondary cooling element.

21. An LED lamp with at least an LED illumination module of claim 6 and with at least one tertiary cooling element thermally connected to the secondary cooling element for carrying off heat.

* * * * *